US008136240B2

(12) United States Patent
Kuczynski et al.

(10) Patent No.: US 8,136,240 B2
(45) Date of Patent: Mar. 20, 2012

(54) METHOD OF FORMING A SUBSTRATE HAVING A PLURALITY OF INSULATOR LAYERS

(75) Inventors: Joseph Kuczynski, Rochester, MN (US); Kevin Albert Splittstoesser, Stewartville, MN (US); Timothy Jerome Tofil, Rochester, MN (US); Paul Alan Vermilyea, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 883 days.

(21) Appl. No.: 12/193,842

(22) Filed: Aug. 19, 2008

(65) Prior Publication Data
US 2010/0044096 A1 Feb. 25, 2010

(51) Int. Cl.
*H01K 3/00* (2006.01)

(52) U.S. Cl. ............... 29/852; 29/830; 29/831; 29/832; 29/846; 29/847

(58) Field of Classification Search .............. 29/852, 29/830, 831, 832, 846, 847; 439/74, 72, 439/75, 66; 361/760, 776, 784, 792; 174/262, 174/264, 265, 266
See application file for complete search history.

(56) References Cited

U.S. PATENT DOCUMENTS

| | | | |
|---|---|---|---|
| 4,448,804 A | 5/1984 | Amelio et al. | |
| 4,642,160 A | 2/1987 | Burgess | |
| 5,342,207 A * | 8/1994 | Sobhani | 439/74 |
| 5,736,679 A | 4/1998 | Kresge et al. | |
| 5,979,044 A * | 11/1999 | Sumi et al. | 29/830 |
| 6,021,564 A | 2/2000 | Hanson | |
| 6,207,351 B1 | 3/2001 | Cywar et al. | |
| 6,810,583 B2 | 11/2004 | Carpenter et al. | |
| 7,500,306 B2 | 3/2009 | Carpenter et al. | |

OTHER PUBLICATIONS

Franz Gizin et al., "Overview of Backdrilling", Sanmina-SCI Corp., San Jose, California, <http://www.sanmina.com/Solutions/pdfs/pcbres/Backdrilling.pdf.>

* cited by examiner

*Primary Examiner* — Derris Banks
*Assistant Examiner* — Tai Nguyen
(74) *Attorney, Agent, or Firm* — Matthew J. Bussan

(57) ABSTRACT

A mechanism is disclosed for providing horizontally split vias in printed wiring boards (PWBs) and other substrates. In one embodiment, the substrate includes a plurality of insulator layers and internal conductive traces. First and second through-holes extend completely through the substrate and respectively pass through first/second ones and third/fourth ones of the internal conductive traces, which are at different depths within the substrate. Photolithographic techniques are used to generate plated-through-hole (PTH) plugs of controlled, variable depth in the through-holes before first/second conductive vias are plated onto the first through-hole and before third/fourth conductive vias are plated onto the second through-hole. The depth of these PTH plugs is controlled (e.g., using a photomask and/or variable laser power) to prevent the conductive vias from extending substantially beyond their respective internal conductive traces, thereby horizontally spitting the two conductive vias plated onto each of the through-holes. This advantageously increases wiring density up to 2×.

10 Claims, 5 Drawing Sheets

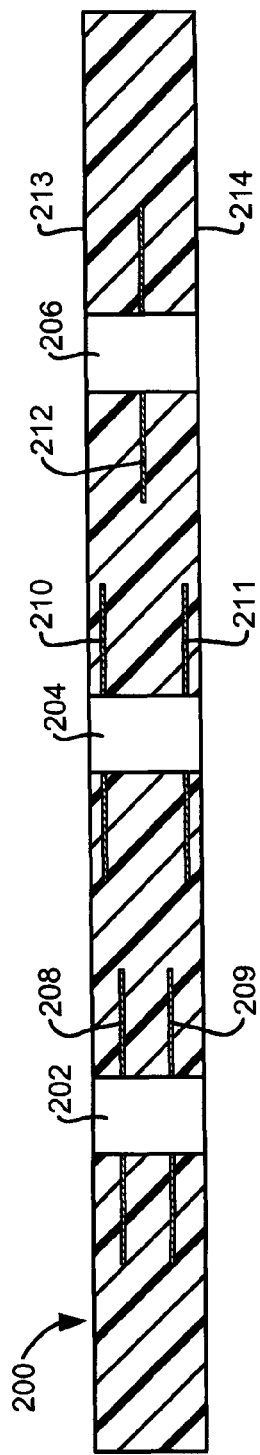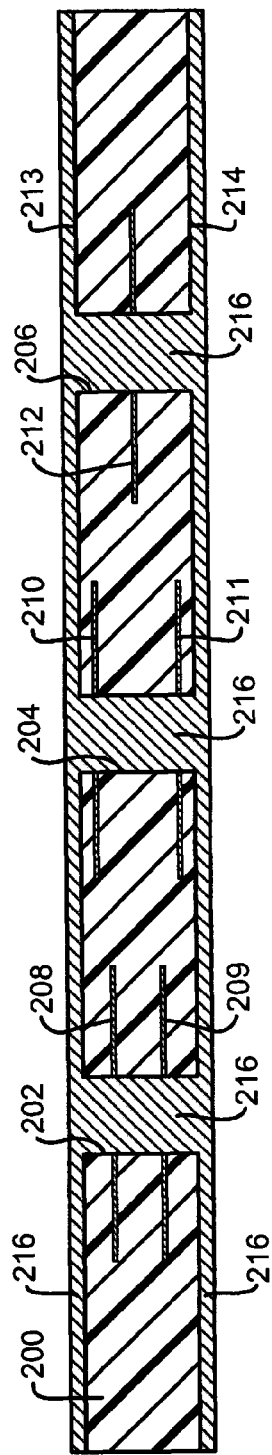

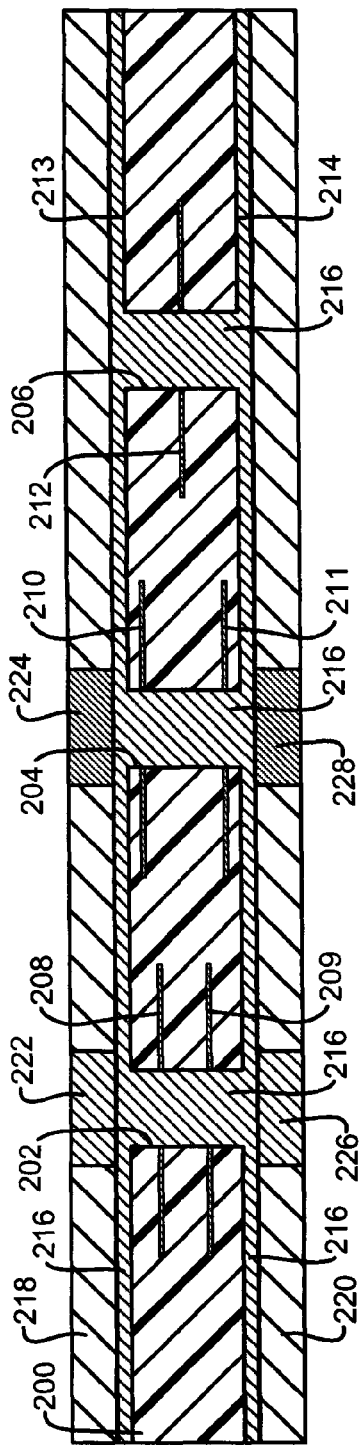
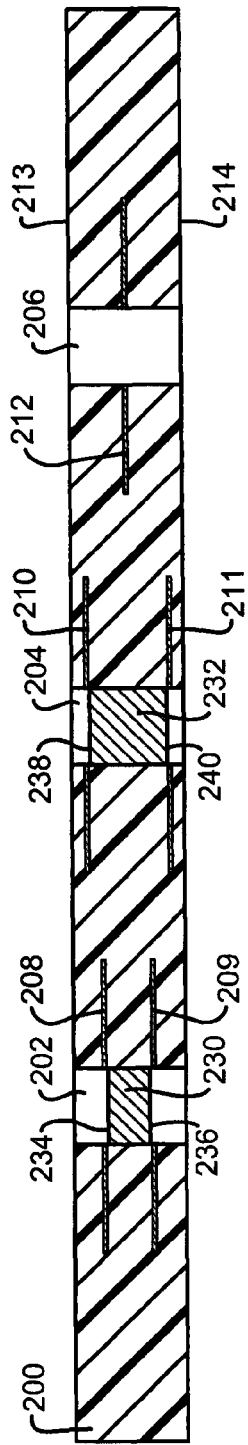

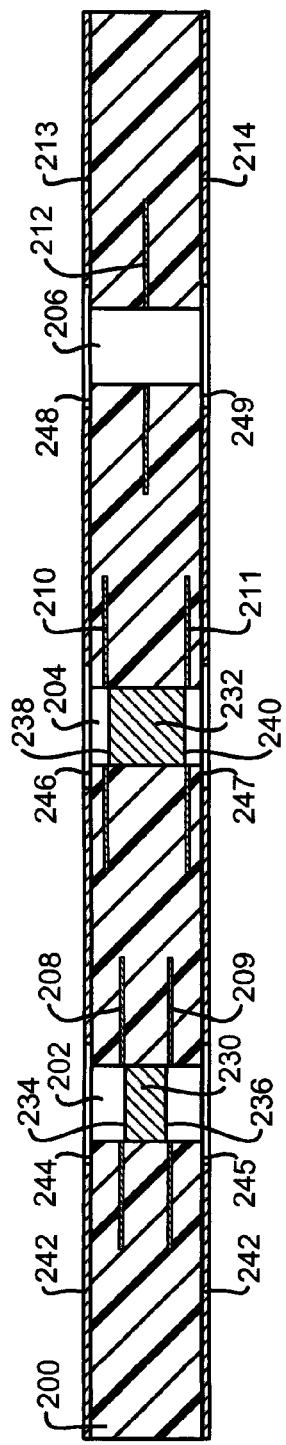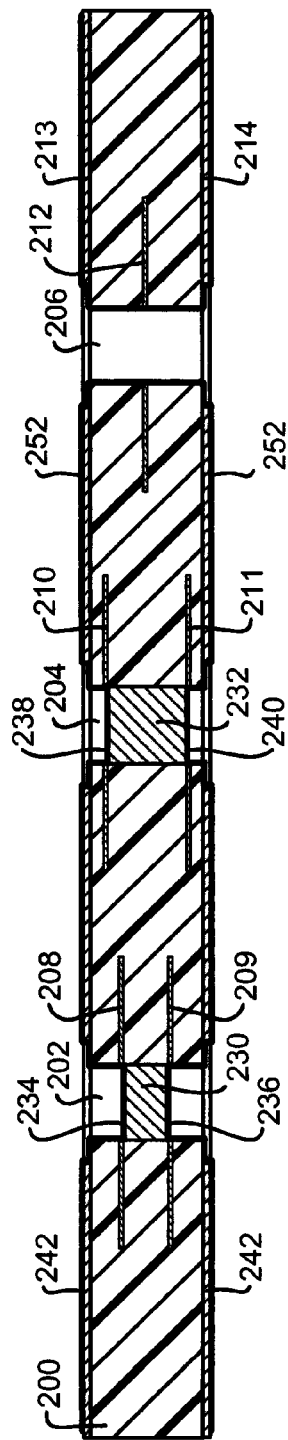

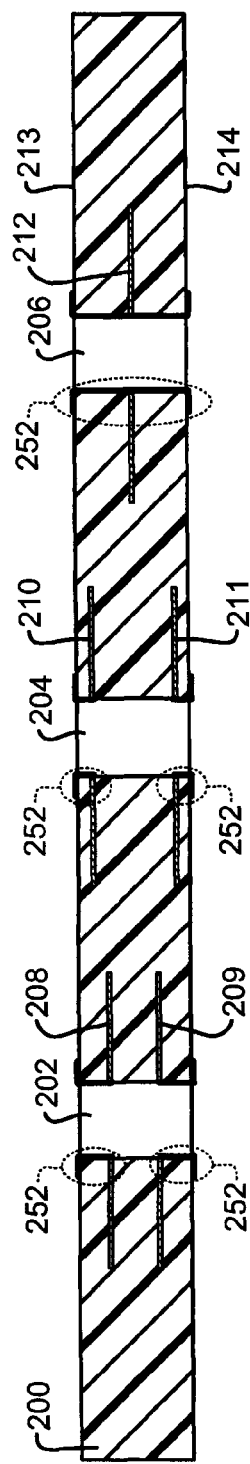
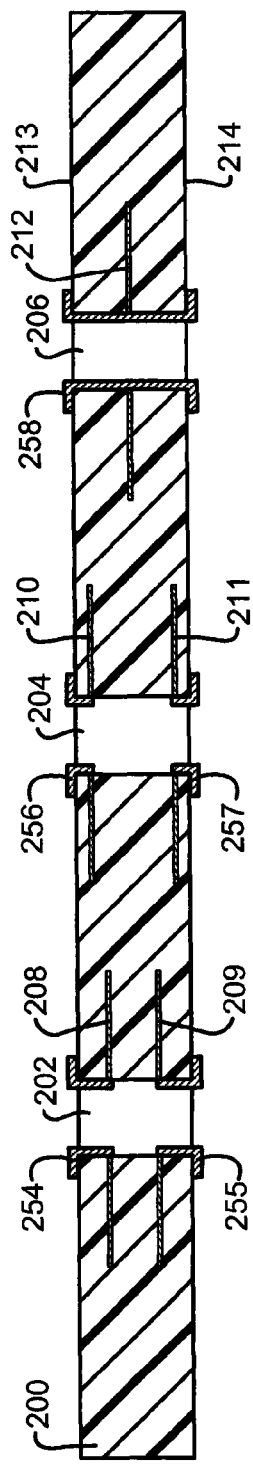

METHOD OF FORMING A SUBSTRATE HAVING A PLURALITY OF INSULATOR LAYERS

CROSS-REFERENCE TO RELATED APPLICATION

This patent application is related to pending U.S. patent application Ser. No. 12/193,837, filed concurrently, entitled "VIA STUB ELIMINATION", which is assigned to the assignee of the instant application, and which is incorporated herein by reference in its entirety.

BACKGROUND OF THE INVENTION

1. Field of Invention

The present invention relates in general to the electrical connector field. More particularly, the present invention relates to a method and apparatus for providing horizontally split vias in printed wiring boards (PWBs) and other substrates, such as interconnect substrates.

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed wiring board (PWB). Printed wiring boards are also known as printed circuit boards (PCBs). When populated with one or more electronic components, a printed wiring board is often referred to as a printed wiring board assembly (PWBA) or a printed circuit board assembly (PCBA). In connecting an electronic module to a PWB, individual electrical contacts on the base of the electronic module must be connected to a plurality of corresponding individual electrical contacts on the PWB. This set of contacts on the PWB dedicated to contacting the electronic module contacts is known as a land grid array (LGA) site when a LGA connector is used to connect the electronic module to the PWB.

Typically, the PWB contains a plurality of vias, each electrically connecting a conductive trace on one layer of the PWB to one or more conductive traces on one or more other layers of the PWB. The vias may be at the LGA site, for example, or elsewhere on the PWB. FIG. 1 illustrates exemplary types of conventional vias in a cross-section of a PWB 100 having a plurality of insulator layers 102 and conductive traces 104. Typically, vias are electroplated (e.g., copper or other highly conductive metal) onto through-holes drilled into the PWB. Such a via, which extends from one surface of the PWB to the other surface of the PWB, is referred to as a plated-through-hole (PTH) via. An exemplary PTH via 110 is illustrated in FIG. 1. In addition to or in lieu of PTH vias, it is also not uncommon for high layer-count PWBs to have blind vias, which are visible only on one surface of the PWB, and/or buried vias, which are visible on neither surface of the PWB. An exemplary blind via 120 is illustrated in FIG. 1, as well as an exemplary buried via 130. Blind vias and buried vias are advantageous over PTH vias in certain respects (e.g., blind vias and buried vias are more efficient from a space utilization perspective than PTH vias). However, blind vias and buried vias are significantly more expensive to fabricate than PTH vias because blind vias and buried vias are produced utilizing additional fabrication steps that are performed as the insulator layers of the PWB are fabricated.

Generally, it is advantageous to increase a substrate's wiring density. Although blind vias and buried vias are more efficient from a space utilization perspective than PTH vias, it is typically impractical to significantly increase a substrate's wiring density through the use of increased blind vias and buried vias.

It should therefore be apparent that a need exists for an enhanced mechanism for increasing wiring density in PWBs and other substrates, such as interconnect substrates.

SUMMARY OF THE INVENTION

According to the preferred embodiments of the present invention, a substrate (e.g., a printed wiring board or other substrate, such as an interconnect substrate) includes a plurality of insulator layers and internal conductive traces. First and second through-holes extend completely through the substrate and respectively pass through first/second ones and third/fourth ones of the internal conductive traces, which are at different depths within the substrate. Photolithographic techniques are used to generate plated-through-hole (PTH) plugs of controlled, variable depth in the through-holes before first/second conductive vias are plated onto the first through-hole and before third/fourth conductive vias are plated onto the second through-hole. The depth of these PTH plugs is controlled (e.g., using a photomask and/or variable laser power) to prevent the conductive vias from extending substantially beyond their respective internal conductive traces, thereby horizontally spitting the two conductive vias plated onto each of the through-holes. This advantageously increases (up to 2x) wiring density.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

FIGS. 2A-2H illustrate successive stages in an exemplary method of fabricating horizontally split vias in a printed wiring board (PWB) in accordance with the preferred embodiments of the present invention.

FIG. 2A illustrates an initial PWB stage in the exemplary method of fabricating horizontally split vias in a printed wiring board (PWB) in accordance with the preferred embodiments of the present invention. FIG. 2A is a partial, sectional view of an exemplary PWB having a plurality of through-holes.

FIG. 2B is a partial, sectional view of the PWB stage shown in FIG. 2A after a liquid, positive tone photoresist is applied thereto in accordance to the preferred embodiments of the present invention.

FIG. 2C is a partial, sectional view of the PWB stage shown in FIG. 2B after photomasks are placed over upper and lower surfaces thereof in accordance with the preferred embodiments of the present invention.

FIG. 2D is a partial, sectional view of the PWB stage shown in FIG. 2C after having been exposed and developed to form plated-through-hole (PTH) plugs of varying depths in the through-holes of the PWB in accordance with the preferred embodiments of the present invention.

FIG. 2E is a partial, sectional view of the PWB stage shown in FIG. 2D after a seed photoresist is applied thereto, exposed, and then developed to open up the through-holes for subsequent seed material application in accordance to the preferred embodiments of the present invention.

FIG. 2F is a partial, sectional view of the PWB stage shown in FIG. 2E after seed material is applied thereto in accordance with the preferred embodiments of the present invention.

FIG. 2G is a partial, sectional view of the PWB stage shown in FIG. 2F after the seed photoresist and the PTH plugs are stripped therefrom in accordance with the preferred embodiments of the present invention.

FIG. 2H is a partial, sectional view of the PWB stage shown in FIG. 2G after vias are plated onto the seed material remaining thereon in accordance with the preferred embodiments of the present invention. FIG. 2H illustrates a final PWB stage of the successive stages in the exemplary method of fabricating horizontally split vias in a PWB illustrated in FIGS. 2A-2H.

DETAILED DESCRIPTION OF THE PREFERRED EMBODIMENTS

1.0 Overview

Figure 1:
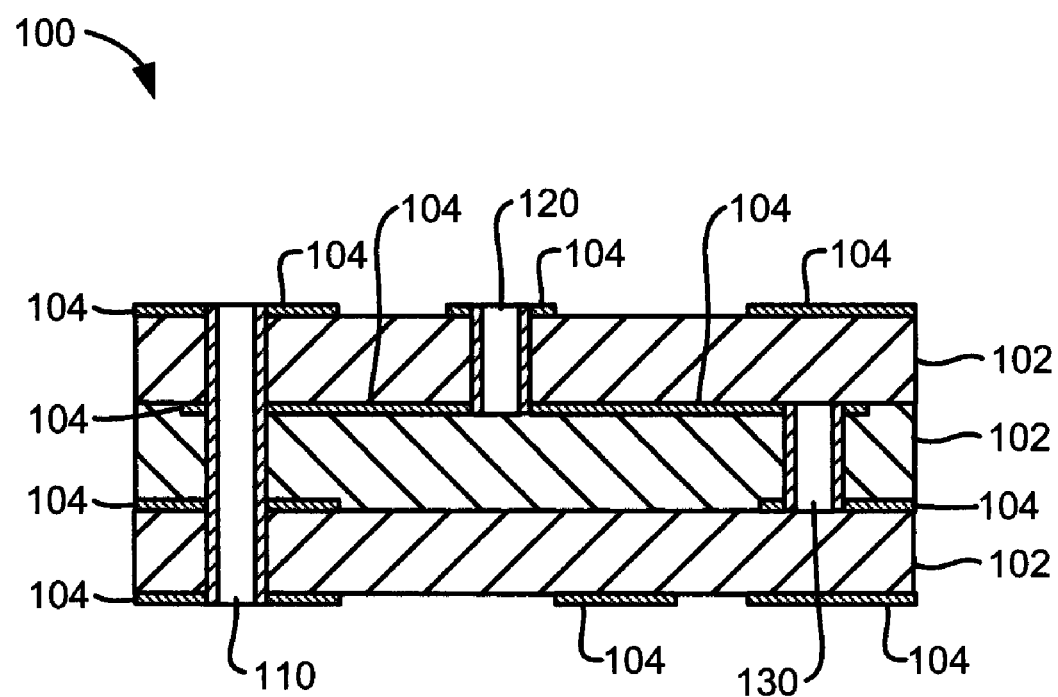
FIG. 1 is a partial, sectional view of a printed wiring board (PWB) having exemplary types of conventional vias, including a plated-through-hole (PTH) via, a blind via and a buried via.

In accordance with the preferred embodiments of the present invention, a substrate (e.g., a printed wiring board or other substrate, such as an interconnect substrate) includes a plurality of insulator layers and internal conductive traces. First and second through-holes extend completely through the substrate and respectively pass through first/second ones and third/fourth ones of the internal conductive traces, which are at different depths within the substrate. Photolithographic techniques are used to generate plated-through-hole (PTH) plugs of controlled, variable depth in the through-holes before first/second conductive vias are plated onto the first through-hole and before third/fourth conductive vias are plated onto the second through-hole. The depth of these PTH plugs is controlled (e.g., using a photomask and/or variable laser power) to prevent the conductive vias from extending substantially beyond their respective internal conductive traces, thereby horizontally spitting the two conductive vias plated onto each of the through-holes. This advantageously increases (up to 2×) wiring density.

In one embodiment, the PTH plug depth is controlled through the use of photomasks in combination with a liquid, positive tone photoresist with which the through-holes are filled. Exposure attenuation elements of a variable neutral density pattern of the photomasks are registered and control exposure depth on a hole-by-hole basis.

In another embodiment, the PTH plug depth is controlled through the use of variable laser power in combination with a liquid, positive tone photoresist with which the through-holes are filled. Exposure depth is controlled on a hole-by-hole basis by varying the laser power directed toward the through-holes.

2.0 Detailed Description

With reference to the figures and in particular FIGS. 2A-2H, there are depicted, in partial sectional views, successive stages in an exemplary method of fabricating horizontally split vias in a printed wiring board (PWB) in accordance with the preferred embodiments of the present invention. FIGS. 2A-2H set forth the preferred order of the stages in this exemplary fabrication method. It must be understood, however, that the various stages may occur at any time relative to one another in accordance with the preferred embodiments of the present invention.

FIG. 2A illustrates an initial stage in the exemplary method of fabricating horizontally split vias in a PWB in accordance with the preferred embodiments of the present invention. FIG. 2A is a partial, sectional view of an exemplary PWB 200 having a plurality of through-holes, such as through-holes 202, 204 and 206, extending completely through the PWB 200. Printed wiring boards are also known as printed circuit boards (PCBs). As is conventional, the PWB 200 includes a plurality of insulator layers (not shown) that separate a plurality of internal conductive traces, such as internal conductive traces 208, 209, 210, 211 and 212. The insulator layers may be, for example, FR-4 (i.e., composite laminate of a resin epoxy reinforced with a woven fiberglass mat) or other suitable organic or inorganic dielectric materials. Typically, such dielectric materials include epoxy resins, ceramics, polyphenylene oxide (PPO)/triallyisocyanurate (TAIC) blends, and perfluorinated or chlorinated materials. The internal conductive traces 208, 209, 210, 211 and 212 may be, for example, copper or other suitable electrically conductive material.

One skilled in the art will appreciate that the PWB 200 shown in FIG. 2A is exemplary. In general, a PWB may contain any number and/or configuration of through-holes, internal conductive traces, and insulator layers. The present invention may be utilized in the context of any PWB or other substrate, such as an interconnect substrate (e.g., an interposer or a module substrate) or a flex cable.

In the exemplary PWB 200 shown in FIG. 2, the through-hole 202 passes through the internal conductive traces 208 and 209, the through-hole 204 passes through the internal conductive traces 210 and 211, and the through-hole 206 passes through the internal conductive trace 212. Within the through-hole 202, the internal trace 209 is deeper (with respect to a surface 213 of the PWB 200) than the internal conductive trace 208. That is, the internal conductive trace 209 is nearer to a surface 214 of the PWB 200 than is the internal conductive trace 208. Similarly, within the through-hole 204, the internal conductive trace 211 is deeper (with respect to the surface 213 of the PWB 200) than the internal conductive trace 210. That is, the internal conductive trace 211 is nearer to the surface 214 of the PWB than is the internal conductive trace 210.

Also, in the exemplary PWB 200 shown in FIG. 2A, the "upper" internal conductive trace 208 in the through-hole 202 is deeper (with respect to the "upper" surface 213 of the PWB 200) than the "upper" internal conductive trace 210 in the through-hole 204. In addition, in the exemplary PWB 200 shown in FIG. 2A, the "lower" internal conductive trace 209 in the through-hole 202 is deeper (with respect to the "lower" surface 214 of the PWB 200) than the "lower" internal conductive trace 211 in the through-hole 204. Accordingly, in the exemplary PWB 200 shown in FIG. 2A, the distance between the internal conductive traces 210 and 211 in the through-hole 204 is greater than the distance between the internal conductive traces 208 and 209 in the through-hole 202.

Ultimately, as shown and described below with reference to FIG. 2H, in accordance with the preferred embodiments of the present invention, electrical connections will be established in through-hole 202 between a contact pad on the surface 213 of the PWB 200 and the internal conductive trace 208 by a horizontally split via 254, and between a contact pad on the surface 214 of the PWB 200 and the internal conductive trace 209 by a horizontally split via 255; as well as in through-hole 204 between a contact pad on the surface 213 of the PWB 200 and the internal conductive trace 210 by a horizontally split via 256, and between a contact pad on the surface 214 of the PWB 200 and the internal conductive trace 211 by a horizontally split via 257.

FIG. 2B is a partial, sectional view of the PWB stage shown in FIG. 2A after a liquid, positive tone photoresist 216 is applied thereto in accordance to the preferred embodiments of the present invention. The liquid, positive tone photoresist 216 covers the surface 213 and the surface 214 of the PWB 200, and fills the through-holes 202, 204 and 206 of the PWB 200. The liquid, positive tone photoresist 216 is "positive tone" in that its solubility in a developer increases upon exposure to UV light or other light at the appropriate wavelength for the chosen photoresist. Typically, light exposure causes carboxylic acids to form in the exposed portions of the photoresist, which are then removed, using a developer (e.g. an aqueous alkaline solution). A suitable example of a liquid, positive tone photoresist is "Shin-Etsu MicroSi SIPR 7120/7121" available from Shin-Etsu MicroSI, Phoenix, Ariz. Other suitable examples include positive tone diazo compounds, such as Diazos "PW 205", "PW 1093", "PW 1160", and "PW 2484" available from AZ Electronic Materials (Germany) GmbH, Wiesbaden, Germany. These diazo compounds include 2-Diazo-1-naphthalene-5-sulfoester and/or 2-Diazo-1-naphthalene-4-sulfoester with 2,3,4-Trishydroxybenzophenone, Novolac cresole resins or p-Cumylphenol.

FIG. 2C is a partial, sectional view of the PWB stage shown in FIG. 2B after photomasks 218 and 220 are placed over upper and lower surfaces thereof, respectively, in accordance with the preferred embodiments of the present invention. The upper photomask 218 and the lower photomask 220, which are preferably either glass or film, each include a variable neutral density pattern to accommodate the depth of the internal conductive trace to which electrical connection is required. For example, the variable neutral density pattern of the upper photomask 218 includes a plurality of exposure attenuation elements 222 and 224 that are respectively registered with through-holes 202 and 204. The exposure attenuation element 222 has a "lesser" light attenuation (as compared to a "greater" light attenuation of the exposure attenuation element 224) which accommodates the depth of the internal conductive trace 208, to which electrical connection is required in an "upper" portion of the through-hole 202. Conversely, the "greater" light attenuation of the exposure attenuation element 224 accommodates the depth of the internal conductive trace 210, to which electrical connection is required in an "upper" portion of the through-hole 204.

Similarly, the variable neutral density pattern of the lower photomask 220 includes a plurality of exposure attenuation elements 226 and 228 that are respectively registered with through-holes 202 and 204. The exposure attenuation element 226 has a "lesser" light attenuation (as compared to a "greater" light attenuation of the exposure attenuation element 228) which accommodates the depth of the internal conductive trace 209, to which electrical connection is required in a "lower" portion of the through-hole 202. Conversely, the "greater" light attenuation of the exposure attenuation element 228 accommodates the depth of the internal conductive trace 211, to which electrical connection is required in a "lower" portion of the through-hole 204.

Hence, the "top-side" exposure of the liquid, positive tone photoresist 216 through the exposure attenuation element 222 is greater than through the exposure attenuation element 224 and, consequently, the liquid, positive tone photoresist 216 in the "upper" portion of the through-hole 202 is exposed to a greater depth than the liquid, positive tone photoresist 216 in the "upper" portion of the through-hole 204. Similarly, the "bottom-side" exposure of the liquid, positive tone photoresist 216 through the exposure attenuation element 226 is greater than through the exposure attenuation element 228 and, consequently, the liquid, positive tone photoresist 216 in the "lower" portion of the through-hole 202 is exposed to a greater depth than the liquid, positive tone photoresist 216 in the "lower" portion of the through-hole 204.

Preferably, the liquid, positive tone photoresist 216 in the through-hole 202 is exposed through top-side exposure to a depth substantially corresponding to or slightly beneath the internal conductive trace 208, and through bottom-side exposure to a depth substantially corresponding to or slightly above the internal conductive trace 209. Similarly, the liquid, positive tone photoresist 216 in the through-hole 204 is preferably exposed through top-side exposure to a depth substantially corresponding to or slightly beneath the internal conductive trace 210, and through bottom-side exposure to a depth substantially corresponding to or slightly above the internal conductive trace 211.

Because the solubility of the liquid, positive tone photoresist 216 increases with light exposure, and because the liquid, positive tone photoresist 216 in the through-hole 202 is exposed through "top-side" exposure to a greater depth than the liquid, positive tone photoresist 216 in the through-hole 204, after the photomask covered and photoresist laden PWB is exposed and developed, as described in more detail below with reference to FIG. 2D, the unexposed liquid, positive tone photoresist 216 remaining in the "upper" portion of the through-holes 202 and 204 will respectively form plated-through-hole (PTH) plugs 230 and 232 at depths in the "upper" portion of the through-holes 202 and 204 corresponding to or slightly beneath the internal conductive trace 208 and the internal conductive trace 210, respectively. Similarly, because the liquid, positive tone photoresist 216 in the through-hole 202 is exposed through "bottom-side" exposure to a greater depth than the liquid, positive tone photoresist 216 in the through-hole 204, after the photomask covered and photoresist laden PWB is exposed and developed, the unexposed liquid, positive tone photoresist 216 remaining in the "lower" portion of the through-holes 202 and 204 will respectively form plated-through-hole (PTH) plugs 230 and 232 at depths in the "lower" portion of the through-holes 202 and 204 corresponding to or slightly above the internal conductive trace 209 and the internal conductive trace 211, respectively.

In general, top-side exposure and bottom-side exposure of the liquid, positive tone photoresist 216 is only attenuated, to any significant extent, by the exposure attenuation elements in accordance with the preferred embodiments of the present invention. That is, portions of the upper photomask 218 and the lower photomask 220 that do not include the variable neutral density pattern's exposure attenuation elements do not significantly attenuate top-side exposure and bottom-side exposure of the underlying liquid, positive tone photoresist 216.

Preferably, the width of each of the exposure attenuation elements (e.g., the exposure attenuation elements 222, 224, 226 and 228) is slightly greater than the width of the underlying through-hole (e.g., the through-holes 202 and 204) to substantially prevent unintended overexposure of the liquid, positive tone photoresist 216 in the underlying through-hole. This prevents light from entering the underlying through-hole at an angle from the edge of the exposure attenuation elements.

In accordance with the preferred embodiments of the present invention, the variable neutral density pattern of the upper photomask 218 and the variable neutral density pattern of the lower photomask 220 do not include exposure attenuation elements for registration with through-holes, such as the through-hole 206, that require a conventional plated-through-hole (PTH). Hence, top-side exposure of the liquid, positive tone photoresist 216 in the through-hole 206 is not attenuated by the upper photomask 218. Similarly, the bottom-side exposure of the liquid, positive tone photoresist 216 in the through-hole 206 is not attenuated by the lower photomask 220. Ultimately, in accordance with the preferred embodiments of the present invention, electrical connection will be established in through-hole 206 between a contact pad on the surface 213 and a contact pad on the surface 214 of the PWB 200 by via 258, shown and described below with reference to FIG. 2H, as well as the internal conductive trace 212.

Preferably, the variable neutral density pattern of the upper photomask 218 and the variable neutral density pattern of the lower photomask 220 are each "neutral" with respect to wavelength of the exposure light. Photomasks suitable for use as the photomasks 218 and 220 are conventional. Typically, a (variable) neutral density pattern is printed on film or a glass plate. For example, "Transmission Step Wedges" available from Stouffer Industries, Inc., Mishawaka, Ind. are representative examples of a neutral density photomask.

FIG. 2D is a partial, sectional view of the PWB stage shown in FIG. 2C after having been exposed and developed to form plated-through-hole (PTH) plugs (e.g., the PTH plugs 230 and 232) of varying depths in the through-holes (e.g., the through-holes 202 and 204) of the PWB 200 in accordance with the preferred embodiments of the present invention. For example, after the photomask covered and photoresist laden PWB shown in FIG. 2C is exposed and developed, the PTH plug 230 is formed at a depth in the "upper" portion of the through-hole 202 substantially corresponding to or slightly beneath the internal conductive trace 208 and at a depth in the "lower" portion of the through-hole 202 substantially corresponding to or slightly above the internal conductive trace 209, while the PTH plug 232 is formed at a depth in the "upper" portion of the through-hole 204 substantially corresponding to or slightly beneath the internal conductive trace 210 and at a depth in the "lower" portion of the through-hole 204 substantially corresponding to or slightly above the internal conductive trace 211.

Exposure renders the liquid, positive tone photoresist 216 soluble in the developer. The liquid, positive tone photoresist 216 is developed with a developer according to the photoresist manufacturer's instructions. Typically, the developer is an aqueous media, such as an aqueous alkaline solution. Depending on the degree of attenuation provided by the exposure attenuation elements, the PTH plugs of varying depths are formed in the through-holes by the liquid, positive tone photoresist 216 that remains insoluble in the developer. For example, the unexposed liquid, positive tone photoresist 216 remaining in the through-holes 202 and 204 will respectively form PTH plugs 230 and 232 at depths in the "upper" portion of the through-holes 202 and 204 corresponding to or slightly beneath the internal conductive traces 208 and 210, respectively, and at depths in the "lower" portion of the through-holes 202 and 204 corresponding to or slightly above the internal conductive traces 209 and 211, respectively.

The PTH plug 230 formed in the through-hole 202 extends from an upper end 234 thereof at or adjacent to (preferably, slightly beneath) the internal conductive trace 208 to a lower end 236 thereof at or adjacent to (preferably, slightly above) the internal conductive trace 209. The PTH plug 232 formed in the through-hole 204 extends from an upper end 238 thereof at or adjacent to (preferably, slightly beneath) the internal conductive trace 210 to a lower end 240 thereof at or adjacent to (preferably, slightly above) the internal conductive trace 211.

FIG. 2E is a partial, sectional view of the PWB stage shown in FIG. 2D after a seed photoresist 242 is applied thereto, exposed, and then developed to open up the through-holes for subsequent seed material application (shown and described below with reference to FIG. 2F) in accordance to the preferred embodiments of the present invention. Preferably, the seed photoresist 242 is a conventional dry film, negative tone photoresist. The seed photoresist 242 is preferably "negative tone" in that its solubility in developer (e.g., an aqueous media) decreases upon exposure to light. Representative examples of suitable conventional dry film photoresists include any of the Dupont™ Riston® dry film photoresists available from Dupont Electronic Technologies, Research Triangle Park, N.C.

The seed photoresist is developed with a developer according to the photoresist manufacturer's instructions. Typically, the developer is an aqueous media.

As shown in FIG. 2E, the seed photoresist 242 covers the surface 213 and the surface 214 of the PWB 200 except where the seed photoresist has been exposed and developed to open up the through-holes 202, 204 and 206 of the PWB 200. For example, the seed photoresist 242 has open regions 244, 246 and 248 on the surface 213 of the PWB 200 immediately adjacent to and surrounding the through-holes 202, 204 and 206, respectively. Similarly, the seed photoresist 242 has open regions 245, 247 and 249 on the surface 214 of the PWB 200 immediately adjacent to and surrounding the through-holes 202, 204 and 206, respectively. Ultimately, in accordance with the preferred embodiments of the present invention, these open regions 244, 245, 246, 247, 248 and 249 on the surfaces 213 and 214 of the PWB 200 define the width of a contact pad portion of each of the vias 254/255 and 256/257 and 258 (shown and described below with reference to FIG. 2H), which are to be formed in the through-holes 202, 204 and 206, respectively.

The seed photoresist must be removed to a sufficient extent from the critical surfaces of the PWB 200 (i.e., the walls of the through-holes 202, 204 and 206 at varying depths, the open regions 244, 246 and 248 on the surface 213, and the open regions 245, 247 and 249 on the surface 214) to provide for an effective subsequent application of the seed material (shown and described below with reference to FIG. 2F) to those critical surfaces in accordance with the preferred embodiments of the present invention. Because the seed photoresist is preferably "negative tone" (i.e., its solubility in the developer decreases upon exposure to light due to polymerization of the exposed photoresist), only seed photoresist that covers the non-critical surfaces of the PWB is to be exposed to UV light or other light at the appropriate wavelength for the chosen photoresist. The seed photoresist that covers the non-critical surfaces of the PWB corresponds to the seed photoresist 242 shown in FIG. 2E.

Conventional photolithographic techniques may be used to expose and develop the seed photoresist to open up the through-holes for subsequent seed material application (shown and described below with reference to FIG. 2F) in accordance to the preferred embodiments of the present invention. For example, a photomask with art work (not shown) may be employed to prevent exposure of the seed photoresist that covers the critical surfaces of the PWB and allow exposure of the seed photoresist that covers the non-critical surfaces of the PWB. The seed photoresist that covers the non-critical surfaces of the PWB is polymerized by exposure to light. The seed photoresist is then developed using a developer, that is, a solvent which dissolves the unexposed portions of the seed photoresist and leaves the polymerized portions of the seed photoresist. The remaining seed photoresist corresponds to the seed photoresist shown in FIG. 2E.

FIG. 2F is a partial, sectional view of the PWB stage shown in FIG. 2E after seed material 252 is applied thereto in accordance with the preferred embodiments of the present invention. The seed material 252 is denoted as a thick black line in FIG. 2F. Preferably, the seed material 252 preferentially adheres to the PWB 200 and can be relatively easily removed with the seed photoresist 242 and the PTH plugs 230 and 232 (which are made from the liquid, positive tone photoresist 216). The seed material 252 is a conventional seeding composition such as a seeding composition containing palladium chloride, HCl, and stannous chloride. For example, U.S. Pat. No. 4,448,804 to Amelio et al., issued May 15, 1984, describes a preferred seeding composition containing palladium chloride, HCl and stannous chloride and is incorporated herein by reference.

The critical surfaces of the PWB 200 (i.e., the walls of the through-holes 202, 204 and 206 at varying depths, the open regions 244, 246 and 248 on the surface 213, and the open regions 245, 247 and 249 on the surface 214) are activated, that is seeded, by contact with the seed material 252. The seed material 252 catalyzes the subsequent electroless copper deposition of vias to the critical surfaces of the PWB 200. For example, electroless copper deposition of vias 254/255, 256/257 and 258 (shown and described below with reference to FIG. 2H) at the through-holes 202, 204 and 206, respectively, is catalyzed by the seed material 252.

FIG. 2G is a partial, sectional view of the PWB stage shown in FIG. 2F after the seed photoresist 242 and the PTH plugs 230 and 232 (which are made from the liquid, positive tone photoresist 216) are stripped therefrom in accordance with the preferred embodiments of the present invention. The PTH plugs 230 and 232 (liquid, positive tone photoresist 216) may be stripped, for example, by exposing the PTH plugs 230 and 232 to light and then developing the exposed PTH plugs 230 and 232, preferably, using the same developer used earlier. Preferably, the PTH plugs 230 and 232 may be stripped using the manufacturer's recommended stripping solution. The seed photoresist 242, which was earlier polymerized, may be stripped using a stripping solvent according to the photoresist manufacturer's instructions. Stripping the seed photoresist 242 and the liquid, positive tone photoresist 216 leaves the patterned seed material 252 only on the critical surfaces of the PWB 200 (i.e., the walls of the through-holes 202, 204 and 206 at varying depths, the open regions 244, 246 and 248 on the surface 213, and the open regions 245, 247 and 249 on the surface 214). That is, the patterned seed material 252 remains on the PWB 200 in a pattern that corresponds to the desired horizontally split via pattern.

FIG. 2H is a partial, sectional view of the PWB stage shown in FIG. 2G after vias 254, 255, 256, 257 and 258 are plated onto the patterned seed material 252 remaining on the PWB 200 in accordance with the preferred embodiments of the present invention. FIG. 2H illustrates a final PWB stage of the successive stages in the exemplary method of fabricating horizontally split vias in a PWB illustrated in FIGS. 2A-2H. The vias 254, 255, 256, 257 and 258 are formed by contacting the PWB 200 with a conventional electroless plating bath, preferably a copper plating bath. The PWB 200 is then removed from the bath. The metal is thus plated onto the patterned seed material 252 in the desired horizontally split via pattern. All the seed material 252 is covered by the electrolessly plated metal; no unplated seed material 252 exists on the PWB 200 after the electroless plating step.

Alternatively, the vias 254, 255, 256, 257 and 258 may be electroplated onto the patterned seed material 252 using a conventional electrolytic deposition process in lieu of utilizing an electroless plating bath.

The plating process results in either a horizontally split via (e.g., horizontally split vias 254/255 and 256/257) or a completely-plated-hole via (e.g., PTH via 258). The horizontally split via 254 extends from a contact-pad-portion on the surface 213 of the PWB 200 to and terminates in an edge substantially at the internal conductive trace 208. The horizontally split via 255 extends from a contact-pad-portion on the surface 214 of the PWB 200 to and terminates in an edge substantially at the internal conductive trace 209. The horizontally split via 256 extends from a contact-pad-portion on the surface 213 of the PWB 200 to and terminates in an edge substantially at the internal conductive trace 210. The horizontally split via 257 extends from a contact-pad-portion on the surface 214 of the PWB 200 to and terminates in an edge substantially at the internal conductive trace 211. The PTH via 258 extends from a contact-pad-portion on the surface 213 of the PWB 200 to a contact-pad-portion on the surface 214 of the PWB 200, as well as passing through the internal conductive trace 212.

In the exemplary method of fabricating horizontally split vias in a PWB illustrated in FIGS. 2A-2H, the PTH plug depth is controlled through the use of photomasks. Exposure attenuation elements of a variable neutral density pattern of the photomasks are registered and control exposure depth on a hole-by-hole basis. Alternatively, or in addition, the PTH plug depth may be controlled through the use of variable laser power. In this alternative exemplary method of fabricating horizontally split vias in accordance with the preferred embodiments of the present invention, exposure depth is controlled on a hole-by-hole basis by varying the laser power directed toward the through-holes.

An example of a suitable laser for use in controlling exposure depth is a conventional SLA laser. Stereolithography is an additive fabrication process that typically uses a liquid, negative tone photoresist (commonly referred to as an "SLA resin") and a UV laser (commonly referred to as an "SLA laser") to build parts layer-upon-layer. Stereolithography is typically used for either rapid prototyping or rapid manufacturing. The device that performs stereolithography is called an "SLA" or "stereolithography apparatus." In the alternative exemplary method, a conventional SLA laser is used in conjunction with the liquid, positive tone photoresist 216 (shown in FIG. 2B) to form the PTH plugs 230 and 232 (shown in FIG. 2D). The exposure depth in accordance with this alternative exemplary method is adjusted on a hole-by-hole basis by varying the power of the SLA laser or other suitable conventional laser, thus obviating the need for a photomask (i.e., no photomask analogous to the photomasks 218 and 220 in FIG. 2C is needed to form the PTH plugs). In all other respects, the alternative exemplary method is identical to the exemplary method illustrated in FIGS. 2A-2H.

In the alternative exemplary method, the "top-side" exposure and the "bottom-side" exposure of the liquid, positive tone photoresist 216 is controlled by varying the power of the SLA laser on a hole-by-hole basis and, consequently, the liquid, positive tone photoresist 216 in the "upper" portion of the through-hole 202 is exposed to UV light from the SLA laser to a greater depth (with respect to the surface 213) than the liquid, positive tone photoresist 216 in the "upper" portion of the through-hole 204. Similarly, the liquid, positive tone photoresist 216 in the "lower" portion of the through-hole 202 is exposed to UV light from the SLA laser to a greater depth (with respect to the surface 214) than the liquid, positive tone photoresist 216 in the "lower" portion of the through-hole 204.

Preferably, in accordance with the alternative exemplary method, the liquid, positive tone photoresist 216 in the "upper" portion of the through-hole 202 is exposed to UV light from the SLA laser to a depth substantially corresponding to or slightly below the internal conductive trace 208, while the liquid, positive tone photoresist 216 in the "upper" portion of the through-hole 204 is exposed to UV light from the SLA laser to a depth substantially corresponding to or slightly below the internal conductive trace 210. Similarly, the liquid, positive tone photoresist 216 in the "lower" portion of the through-hole 202 is preferably exposed to UV light from the SLA laser to a depth substantially corresponding to or slightly above the internal conductive trace 209, while the liquid, positive tone photoresist 216 in the "lower" portion of the through-hole 204 is exposed to UV light from the SLA laser to a depth substantially corresponding to or slightly above the internal conductive trace 211.

Because the solubility of the liquid, positive tone photoresist 216 increases with light exposure, and because the liquid, positive tone photoresist 216 in the through-hole 202 is exposed through "top-side" exposure to UV light from the SLA laser to a greater depth than the liquid, positive tone photoresist 216 in the through-hole 204, after the photoresist laden PWB is exposed and developed, as described in more detail above with reference to FIG. 2D, the unexposed liquid, positive tone photoresist 216 remaining in the "upper" portion of the through-holes 202 and 204 will respectively form plated-through-hole (PTH) plugs 230 and 232 at depths in the "upper" portion of the through-holes 202 and 204 corresponding to or slightly beneath the internal conductive trace 208 and the internal conductive trace 210, respectively. Similarly, because the liquid, positive tone photoresist 216 in the through-hole 202 is exposed through "bottom-side" exposure to UV light from the SLA laser to a greater depth than the liquid, positive tone photoresist 216 in the through-hole 204, after the photoresist laden PWB is exposed and developed, the unexposed liquid, positive tone photoresist 216 remaining in the "lower" portion of the through-holes 202 and 204 will respectively form plated-through-hole (PTH) plugs 230 and 232 at depths in the "lower" portion of the through-holes 202 and 204 corresponding to or slightly above the internal conductive trace 209 and the internal conductive trace 211, respectively.

In accordance with the alternative exemplary method, the SLA laser also exposes through-holes, such as the through-hole 206, that require a conventional plated-through-hole (PTH). Hence, the liquid, positive tone photoresist 216 in the through-hole 206 is exposed to UV light from the SLA laser. Also, in accordance with the alternative exemplary method, the liquid, positive tone photoresist 216 on the surface 213 and the surface 214 is exposed to UV light from the SLA laser.

One skilled in the art will appreciate that many variations are possible within the scope of the present invention. For example, although the preferred embodiments of the present invention are described herein within the context of a printed wiring board (PWB), the present invention may be utilized in the context of other substrates, such as an interconnect substrate (e.g., an interposer or a module substrate) or a flex cable. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. A method comprising the steps of:
    providing a substrate having a plurality of insulator layers and a plurality of internal conductive traces, wherein a plurality of through-holes extend completely through the substrate from a first surface of the substrate to a second surface of the substrate, wherein a first one of the through-holes passes through a first and a second of the internal conductive traces, and wherein the second internal conductive trace lies deeper within the substrate with respect to the substrate's first surface than does the first internal conductive trace;
    plating a first conductive via onto the first through-hole so that the first conductive via extends from the substrate's first surface to and terminates substantially at the first internal conductive trace;
    plating a second conductive via onto the first through-hole so that the second conductive via extends from the substrate's second surface to and terminates substantially at the second internal conductive trace;
    providing a plated-through-hole (PTH) plug in the first through-hole, wherein the PTH plug extends from a first end thereof at or adjacent to the first internal conductive trace to a second end thereof at or adjacent to the second internal conductive trace;
    providing a seed photoresist on portions of the substrate's first and second surfaces, wherein the seed photoresist has open regions in the vicinity of the first through-hole, and wherein the open regions of the seed photoresist expose a portion of the substrate's first surface adjacent the first through-hole, a portion of the first through-hole extending from the substrate's first surface to the first internal conductive trace, the first end of the PTH plug, a portion of the substrate's second surface adjacent the first through-hole, a portion of the first through-hole extending from the substrate's second surface to the second internal conductive trace, and the second end of the PTH plug;
    applying seed material to the seed photoresist, the exposed portions of the substrate's first and second surfaces, the exposed portions of the first through-hole, and the exposed first and second ends of the PTH plug;
    stripping the PTH plug and the seed photoresist so that the seed material remains substantially only at a portion of the substrate's first surface adjacent the first through-hole, a portion of the first through-hole extending from the substrate's first surface to the first internal conductive trace, a portion of the substrate's second surface adjacent the first through-hole, and a portion of the first through-hole extending from the substrate's second surface to the second internal conductive trace.

2. The method as recited in claim 1, wherein the step of plating the first conductive via onto the first through-hole and the step of plating the second conductive via onto the first through-hole are performed simultaneously and include the step of plating a conductive material onto the portions of the seed material that remain after the stripping step by contacting the substrate with an electroless plating bath.

3. The method as recited in claim 1, wherein the step of providing a plated-through-hole (PTH) plug in the first through-hole comprises the steps of:
    laminating the substrate's first and second surfaces with a liquid, positive tone photoresist, wherein the liquid, positive tone photoresist substantially fills the first through-hole;
    placing a first photomask over the substrate's first surface laminated with the liquid, positive tone photoresist, wherein the first photomask includes a variable neutral density pattern having a plurality of exposure attenuation elements, and wherein a first one of the exposure attenuation elements of the first photomask is registered with the first through-hole;
    placing a second photomask over the substrate's second surface laminated with the liquid, positive tone photoresist, wherein the second photomask includes a variable neutral density pattern having a plurality of exposure attenuation elements, and wherein a first one of the exposure attenuation elements of the second photomask is registered with the first through-hole;
  exposing, through the first photomask and the second photomask, the substrate's first and second surfaces laminated with the liquid, positive tone photoresist.
4. The method as recited in claim 1, wherein the step of providing a plated-through-hole (PTH) plug in the first through-hole comprises the steps of:
  laminating the substrate's first and second surfaces with a liquid, positive tone photoresist, wherein the liquid, positive tone photoresist substantially fills the first through-hole;
  exposing the liquid, positive tone photoresist in the first through-hole to laser light from the direction of the substrate's first surface, wherein the power of the laser light directed into the first through-hole is sufficient to expose the liquid, positive tone photoresist in the first through-hole to a depth at or adjacent to the first internal conductive trace;
  exposing the liquid, positive tone photoresist in the first through-hole to laser light from the direction of the substrate's second surface, wherein the power of the laser light directed into the first through-hole is sufficient to expose the liquid, positive tone photoresist in the first through-hole to a depth at or adjacent to the second internal conductive trace.
5. The method as recited in claim 1, wherein the step of providing a first plated-through-hole (PTH) plug in the first through-hole and the step of providing a second plated-through-hole (PTH) plug in the second through-hole comprise the steps of:
  laminating the substrate's first and second surfaces with a liquid, positive tone photoresist, wherein the liquid, positive tone photoresist substantially fills the first and second through-holes;
  exposing the liquid, positive tone photoresist in the first through-hole to laser light from the direction of the substrate's first surface, wherein the power of the laser light directed into the first through-hole is sufficient to expose the liquid, positive tone photoresist in the first through-hole to a depth at or adjacent to the first internal conductive trace;
  exposing the liquid, positive tone photoresist in the second through-hole to laser light from the direction of the substrate's first surface, wherein the power of the laser light directed into the second through-hole is sufficient to expose the liquid, positive tone photoresist in the second through-hole to a depth at or adjacent to the third internal conductive trace;
  exposing the liquid, positive tone photoresist in the first through-hole to laser light from the direction of the substrate's second surface, wherein the power of the laser light directed into the first through-hole is sufficient to expose the liquid, positive tone photoresist in the first through-hole to a depth at or adjacent to the second internal conductive trace;
  exposing the liquid, positive tone photoresist in the second through-hole to laser light from the direction of the substrate's second surface, wherein the power of the laser light directed into the second through-hole is sufficient to expose the liquid, positive tone photoresist in the second through-hole to a depth at or adjacent to the fourth internal conductive trace.

6. The method as recited in claim 5, wherein the power of the laser light is adjusted on a hole-by-hole basis during the exposing steps.

7. A method comprising the steps of:
  providing a substrate having a plurality of insulator layers and a plurality of internal conductive traces, wherein a plurality of through-holes extend completely through the substrate from a first surface of the substrate to a second surface of the substrate, wherein a first one of the through-holes passes through a first and a second of the internal conductive traces, wherein the second internal conductive trace lies deeper within the substrate with respect to the substrate's first surface than does the first internal conductive trace, wherein a second one of the through-holes passes through a third and a fourth of the internal conductive traces, and wherein the fourth internal conductive trace lies deeper within the substrate with respect to the substrate's first surface than does the third internal conductive trace;
  plating a first conductive via onto the first through-hole so that the first conductive via extends from the substrate's first surface to and terminates substantially at the first internal conductive trace;
  plating a second conductive via onto the first through-hole so that the second conductive via extends from the substrate's second surface to and terminates substantially at the second internal conductive trace;
  plating a third conductive via onto the second through-hole so that the third conductive via extends from the substrate's first surface to and terminates substantially at the third internal conductive trace;
  plating a fourth conductive via onto the second through-hole so that the fourth conductive via extends from the substrate's second surface to and terminates substantially at the fourth internal conductive trace;
  providing a first plated-through-hole (PTH) plug in the first through-hole, wherein the first PTH plug extends from a first end thereof at or adjacent to the first internal conductive trace to a second end thereof at or adjacent to the second internal conductive trace;
  providing a second plated-through-hole (PTH) plug in the second through-hole, wherein the second PTH plug extends from a first end thereof at or adjacent to the third internal conductive trace to a second end thereof at or adjacent to the fourth internal conductive trace;
  providing a seed photoresist on portions of the substrate's first and second surfaces, wherein the seed photoresist has open regions in the vicinity of the first and the second through-holes, and wherein the open regions of the seed photoresist expose a portion of the substrate's first surface adjacent the first through-hole, a portion of the substrate's first surface adjacent the second through-hole, a portion of the first through-hole extending from the substrate's first surface to the first internal conductive trace, a portion of the second through-hole extending from the substrate's first surface to the third internal conductive trace, the first end of the first and the second PTH plugs, a portion of the substrate's second surface adjacent the first through-hole, a portion of the substrate's second surface adjacent the second through-hole, a portion of the first through-hole extending from the substrate's second surface to the second internal conductive trace, a portion of the second through-hole extending from the substrate's second surface to the fourth internal conductive trace, and the second end of the first and the second PTH plugs;

applying seed material to the seed photoresist, the exposed portions of the substrate's first and second surfaces, the exposed portions of the first and the second through-holes, and the exposed first and second ends of the first and the second PTH plugs;

stripping the first and the second PTH plugs and the seed photoresist so that the seed material remains substantially only at a portion of the substrate's first surface adjacent the first through-hole, a portion of the first through-hole extending from the substrate's first surface to the first internal conductive trace, a portion of the substrate's first surface adjacent the second through-hole, a portion of the second through-hole extending from the substrate's first surface to the third internal conductive trace, a portion of the substrate's second surface adjacent the first through-hole, a portion of the first through-hole extending from the substrate's second surface to the second internal conductive trace, a portion of the substrate's second surface adjacent the second through-hole, and a portion of the second through-hole extending from the substrate's second surface to the fourth internal conductive trace.

8. The method as recited in claim 7, wherein the steps of plating the first, second, third and fourth conductive vias onto the first and the second through-holes are performed simultaneously and include the step of plating a conductive material onto the portions of the seed material that remain after the stripping step by contacting the substrate with an electroless plating bath.

9. The method as recited in claim 7, wherein the step of providing a first plated-through-hole (PTH) plug in the first through-hole and the step of providing a second plated-through-hole (PTH) plug in the second through-hole are performed simultaneously and comprise the steps of:

laminating the substrate's first and second surfaces with a liquid, positive tone photoresist, wherein the liquid, positive tone photoresist substantially fills the first and the second through-holes;

placing a first photomask over the substrate's first surface laminated with the liquid, positive tone photoresist, wherein the first photomask includes a variable neutral density pattern having a plurality of exposure attenuation elements, and wherein a first one and a second one of the exposure attenuation elements of the first photomask are respectively registered with the first and the second through-holes;

placing a second photomask over the substrate's second surface laminated with the liquid, positive tone photoresist, wherein the second photomask includes a variable neutral density pattern having a plurality of exposure attenuation elements, and wherein a first one and a second one of the exposure attenuation elements of the second photomask are respectively registered with the first and the second through-holes;

exposing, through the first photomask and the second photomask, the substrate's first and second surfaces laminated with the liquid, positive tone photoresist.

10. A method comprising the steps of:

providing a substrate having a plurality of insulator layers and a plurality of internal conductive traces, wherein a plurality of through-holes extend completely through the substrate from a first surface of the substrate to a second surface of the substrate, wherein a first one of the through-holes passes through a first and a second of the internal conductive traces, wherein the second internal conductive trace lies deeper within the substrate with respect to the substrate's first surface than does the first internal conductive trace, wherein a second one of the through-holes passes through a third and a fourth of the internal conductive traces, wherein the fourth internal conductive trace lies deeper within the substrate with respect to the substrate's first surface than does the third internal conductive trace, and wherein the distance between the first and the second internal conductive traces in the first through-hole is greater than the distance between the third and the fourth internal conductive traces in the second through-hole;

plating a first conductive via onto the first through-hole so that the first conductive via extends from the substrate's first surface to and terminates substantially at the first internal conductive trace;

plating a second conductive via onto the first through-hole so that the second conductive via extends from the substrate's second surface to and terminates substantially at the second internal conductive trace;

plating a third conductive via onto the second through-hole so that the third conductive via extends from the substrate's first surface to and terminates substantially at the third internal conductive trace;

plating a fourth conductive via onto the second through-hole so that the fourth conductive via extends from the substrate's second surface to and terminates substantially at the fourth internal conductive trace.

* * * * *